US010852365B2

(12) United States Patent
Guettinger et al.

(10) Patent No.: US 10,852,365 B2
(45) Date of Patent: Dec. 1, 2020

(54) STRAY FIELD SUPPRESSION IN MAGNETIC SENSOR WHEATSTONE BRIDGES

(71) Applicant: Infineon Technologies AG, Neubiberg (DE)

(72) Inventors: Johannes Guettinger, Lind ob Velden (AT); Simon Hainz, Villach (AT); Armin Satz, Villach (AT)

(73) Assignee: Infineon Technologies AG (DE)

( * ) Notice: Subject to any disclaimer, the term of this patent is extended or adjusted under 35 U.S.C. 154(b) by 159 days.

(21) Appl. No.: 16/023,914

(22) Filed: Jun. 29, 2018

(65) Prior Publication Data

US 2020/0003849 A1    Jan. 2, 2020

(51) Int. Cl.
| | | |
|---|---|---|
| *G01R 33/02* | (2006.01) | |
| *G01R 33/025* | (2006.01) | |
| *G01R 33/00* | (2006.01) | |
| *G01R 33/09* | (2006.01) | |
| *H01L 43/08* | (2006.01) | |

(52) U.S. Cl.
CPC ....... *G01R 33/025* (2013.01); *G01R 33/0023* (2013.01); *G01R 33/0047* (2013.01); *G01R 33/0094* (2013.01); *G01R 33/09* (2013.01); *G01R 33/093* (2013.01); *G01R 33/096* (2013.01); *G01R 33/098* (2013.01); *H01L 43/08* (2013.01); *H01L 2224/48091* (2013.01); *H01L 2924/00014* (2013.01); *H01L 2924/181* (2013.01)

(58) Field of Classification Search
CPC .... G01R 33/09; G01R 33/098; G01R 33/093; G01R 33/096; H01L 43/08; H01L 2224/48091; H01L 2924/00014; H01L 2924/181
See application file for complete search history.

(56) References Cited

U.S. PATENT DOCUMENTS

| | | | |
|---|---|---|---|
| 2008/0278158 A1* | 11/2008 | Granig | ................... B82Y 25/00 324/247 |
| 2015/0309128 A1* | 10/2015 | Raberg | ............... G01R 33/0041 324/252 |
| 2015/0377646 A1* | 12/2015 | Meyer | ................ G01R 33/0023 324/207.25 |
| 2019/0025346 A1* | 1/2019 | Latham | ................... G01R 33/09 |
| 2019/0064287 A1* | 2/2019 | Koeck | ..................... G01R 33/07 |
| 2019/0277874 A1* | 9/2019 | Hainz | ..................... G01P 3/481 |
| 2019/0339340 A1* | 11/2019 | Hainz | .................. G01R 33/091 |

* cited by examiner

*Primary Examiner* — Raul J Rios Russo
(74) *Attorney, Agent, or Firm* — Design IP

(57) ABSTRACT

A magnetic sensor includes a bridge circuit including a plurality of magnetic field sensor elements, each configured to generate a sensor signal in response to the magnetic field impinging thereon, where the bridge circuit is configured to generate a differential signal based on sensor signals generated by the plurality of magnetic field sensor elements. The bridge circuit further includes a plurality of resistors, where at least one resistor of the plurality of resistors is coupled in parallel to each of the plurality of magnetic field sensor elements.

24 Claims, 6 Drawing Sheets

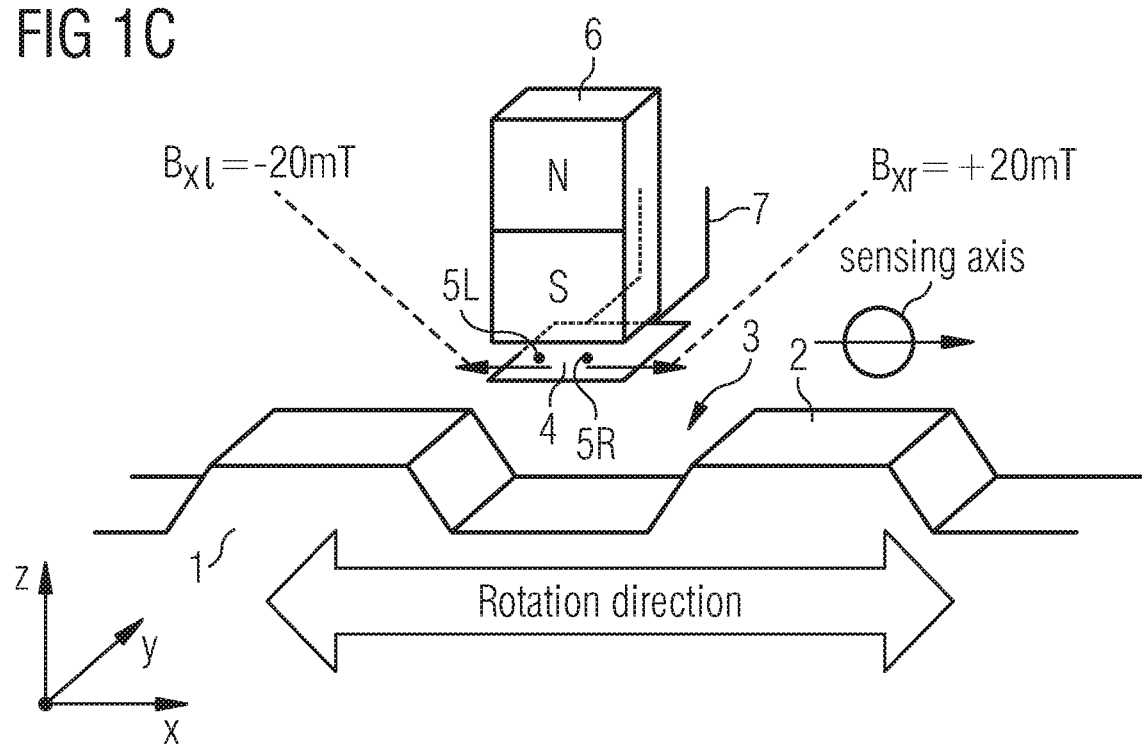

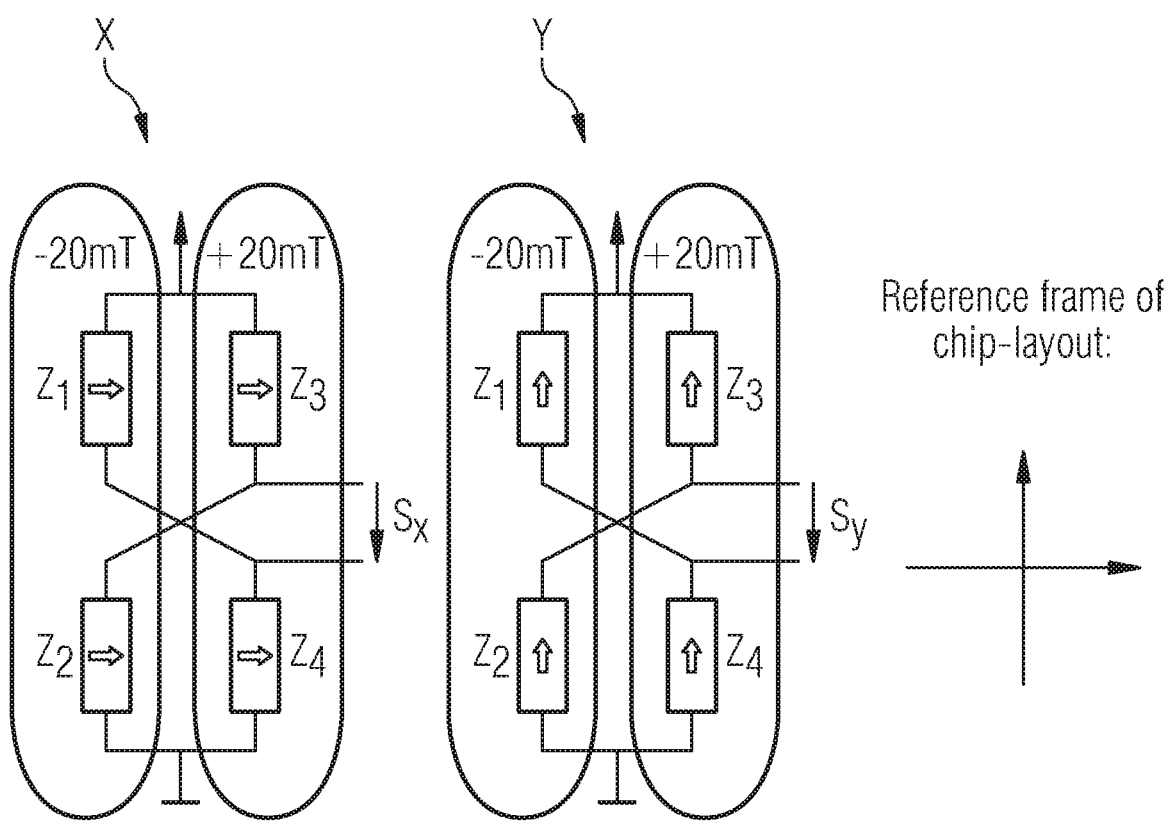

STRAY FIELD SUPPRESSION IN MAGNETIC SENSOR WHEATSTONE BRIDGES

FIELD

The present disclosure relates generally magnetic sensors, and, more particularly, to a magnetic sensor with a sensor bridge circuit.

BACKGROUND

In the field of speed sensing, a sinusoidal signal may be generated by a magnetic sensor in response to a rotation of a target object, such as a wheel, camshaft, crankshaft, or the like. The sinusoidal signal may be translated into pulses, which is further translated into a movement detection or a speed output.

A back bias magnet may be used to generate a differential magnetic field incident on a left sensing location and a right sensing location. The differential magnetic field incident is modulated by a tooth or a magnetic pole of the rotating wheel. A speed signal is generated as a measurement of the differential magnetic field on the left and the right sensing locations. However, xMR sensor concepts use a Wheatstone bridge configuration with half of the bridge on the left location and the other half of the bridge on the right location. This bridge configuration works well as long as the magnetic operation point (MOP) on the left and right half of the bridge equals each other. On mismatch of the MOP, homogeneous stray fields may influence the output of the bridge and stray field robustness may not be fully realized.

Therefore, an improved device having better stray field robustness may be desirable.

SUMMARY

According to one or more embodiments, a magnetic sensor includes a bridge circuit including a plurality of magnetic field sensor elements, each configured to generate a sensor signal in response to the magnetic field impinging thereon, where the bridge circuit is configured to generate a differential signal based on sensor signals generated by the plurality of magnetic field sensor elements. The bridge circuit further includes a plurality of resistors, where at least one resistor of the plurality of resistors is coupled in parallel to each of the plurality of magnetic field sensor elements.

According to another embodiment, magnetic sensor includes a bridge circuit including a plurality of magnetic field sensor elements, each configured to generate a sensor signal in response to the magnetic field impinging thereon. The bridge circuit includes a plurality of parallel branches including a plurality of resistive elements and a plurality of switches, where each parallel branch of the plurality of parallel branches includes a corresponding resistive element of the plurality of resistive elements and a corresponding switch of the plurality of switches. Each parallel branch of the plurality of parallel branches is switchably coupled in parallel to a different one of the plurality of magnetic field sensor elements based on a switching state of the corresponding switch. The magnetic sensor further includes a controller configured to transmit control signals to the bridge circuit for controlling switching states of the first plurality of switches.

According to another embodiment, a magnetic sensor module, includes a magnet configured to produce a differential magnetic field, the differential magnetic field having a first differential field portion and a second differential field portion; a bridge circuit including a plurality of magnetic field sensor elements, including a first pair of sensor elements disposed in the first differential field portion and a second pair of sensor elements disposed in the second differential field portion, where the bridge circuit is configured to generate a differential signal based on sensor signals generated by the plurality of magnetic field sensor elements. The bridge circuit further includes a plurality of resistors, where at least one resistor of the plurality of resistors is coupled in parallel to each of the plurality of magnetic field sensor elements.

According to another embodiment, a magnetic sensor module, includes a magnet configured to produce a differential magnetic field, the differential magnetic field having a first differential field portion and a second differential field portion; a bridge circuit including a plurality of magnetic field sensor elements, including a first pair of sensor elements disposed in the first differential field portion and a second pair of sensor elements disposed in the second differential field portion. The bridge circuit further includes a plurality of parallel branches including a plurality of resistive elements and a plurality of switches, where each parallel branch of the plurality of parallel branches includes a corresponding resistive element of the plurality of resistive elements and a corresponding switch of the plurality of switches. Each parallel branch of the plurality of parallel branches is switchably coupled in parallel to a different one of the plurality of magnetic field sensor elements based on a switching state of the corresponding switch. The magnetic sensor module further includes a controller configured to transmit control signals to the bridge circuit for controlling switching states of the plurality of switches.

BRIEF DESCRIPTION OF THE DRAWINGS

Embodiments are described herein making reference to the appended drawings.

FIG. 1C illustrates a magnetic field sensing principle with a magnetic encoder according to one or more embodiments;

FIG. 4 is a schematic diagram illustrating two example sensor bridge configurations using four xMR sensor elements according to one or more embodiments;

DETAILED DESCRIPTION

Figure 1A:
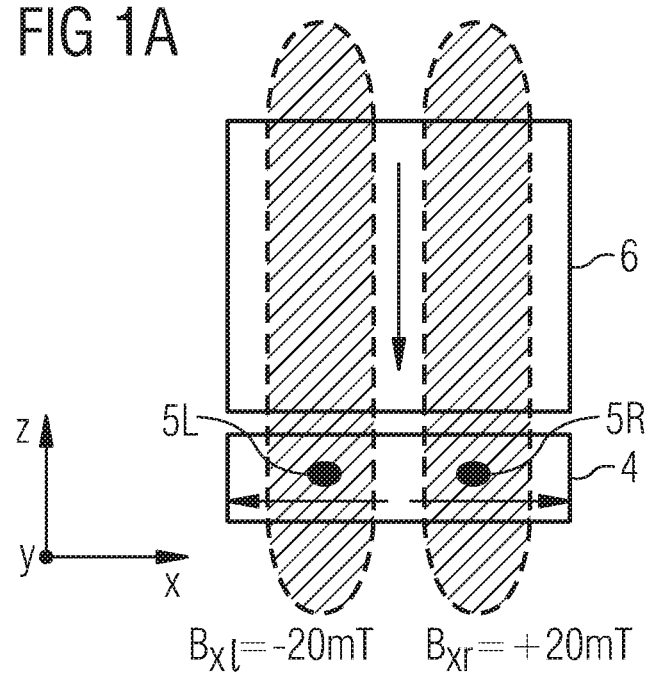
FIGS. 1A and 1B shows a cross-sectional view illustrating a magnetic field sensing principle according to one or more embodiments.

In the following, various embodiments will be described in detail referring to the attached drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided. In addition, features of the different embodiments described hereinafter may be combined with each other to form further embodiments, unless specifically noted otherwise. For example, variations or modifications described with respect to one of the embodiments may also be applicable to other embodiments unless noted to the contrary.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. Functional blocks may be implemented in hardware, firmware, software, or a combination thereof.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be a an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may be used interchangeably throughout this description.

Magnetic sensors, as provided herein, may be magnetoresistive sensors. Magnetoresistance is a property of a material to change the value of its electrical resistance when an external magnetic field is applied to it. Some examples of magnetoresistive effects are Giant Magneto-Resistance (GMR), which is a quantum mechanical magnetoresistance effect observed in thin-film structures composed of alternating ferromagnetic and non-magnetic conductive layers, Tunnel Magneto-Resistance (TMR), which is a magnetoresistive effect that occurs in a magnetic tunnel junction (MTJ), which is a component consisting of two ferromagnets separated by a thin insulator, or Anisotropic Magneto-Resistance (AMR), which is a property of a material in which a dependence of electrical resistance on the angle between the direction of electric current and direction of magnetization is observed. For example, in the case of AMR sensors, a resistance for an AMR sensor element changes according to a square of a sine of an angle of the magnetic field component projected on a sensing axis of the ARM sensor element.

The plurality of different magnetoresistive effects is commonly abbreviated as xMR, wherein the "x" acts as a placeholder for the various magnetoresistive effects. xMR sensors can detect the orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (i.e., a reference direction). The reference magnetization is a magnetization direction that provides a sensing direction corresponding to a sensing axis of the xMR sensor. Accordingly, if a magnetic field component points exactly in the same direction as the reference direction, a resistance of the xMR sensor element is at a maximum, and, if a magnetic field component points exactly in the opposite direction as the reference direction, the resistance of the xMR sensor element is at a minimum. A magnetic field component may be, for example, an x-magnetic field component (Bx), a y-magnetic field component (By), or a z-magnetic field component (Bz), where the Bx and By field components are in-plane to the magnetic sensor, and Bz is out-of-plane to the magnetic sensor.

In some applications, an xMR sensor includes a plurality of magnetoresistive sensor elements, which have different reference magnetizations. Examples of such applications, in which various reference magnetizations are used, are angle sensors, compass sensors, or specific types of speed sensors (e.g., speed sensors in a bridge arrangement).

By way of example, such magnetoresistive sensor elements are used in speed, angle or rotational speed measuring apparatuses, in which magnets may be moved relative to an magnetoresistive sensor elements and hence the magnetic field at the location of the magnetoresistive sensor element changes in the case of movement, which, in turn, leads to a measurable change in resistance.

According to one or more embodiments, a magnetic field sensor and a sensor circuit may be both accommodated (i.e., integrated) in the same chip package (e.g., a plastic encapsulated package, such as leaded package or leadless package, or a surface mounted device (SMD)-package). This chip package may also be referred to as sensor package. The sensor package may be combined with a back bias magnet to form a sensor module, sensor device, or the like.

The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. Therefore, the sensor package may include a circuit that conditions and amplifies the small signal of the magnetic field sensor element via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

Embodiments herein may employ one or more bridge circuits. As used herein, "bridge circuit," "bridge device," and "bridge" may be used interchangeably. A bridge circuit is a topology of electrical circuit in which two circuit branches (usually in parallel with each other) are "bridged" by a third branch connected between the first two branches at some intermediate point along them. A bridge circuit may include passive elements, such as resistive, capacitive, and inductive elements, or a combination thereof.

Magnetoresistive sensor elements of an xMR sensor are resistive elements that may be arranged in a bridge configuration. A resistive value of the one or more magnetic field sensor elements may change when exposed to a magnetic field. The resistive value, which corresponds to a characteristic of the magnetic field, may be measured such that information regarding the characteristic of the magnetic field is obtained. Further, the resistive value may be measured in the form of a voltage or current measurement. Thus, magnetic field sensor elements in an xMR sensor may be arranged in a bridge formation to provide a resistance value (e.g., in the form of a voltage output) corresponding to a measured characteristic of a magnetic field.

Magnetic field sensors provided herein may be configured for incremental speed, position measurement, and rotation direction detection of a rotating magnetic encoder, such as a magnetic encoder (e.g., wheel) or camshaft.

One type of magnetic rotary encoder may be a ferromagnetic encoder, which may be a toothed wheel or a toothed disc of ferromagnetic material with holes or notches that pass in front of the magnetic field sensor. The magnetic field may be produced by a back bias magnet coupled to a back of the magnetic field sensor. Thus, the magnetic field pattern of the magnetic field produced by the back bias magnet is altered by the passing of teeth and notches of the rotating magnetic encoder. Hence, the strength of the of the magnetic field produced by the back bias magnet in certain sensing planes or sensing directions (e.g., x-, y-, and z-planes or directions) is altered according to the change in the magnetic field pattern.

A second type of magnetic rotary encoder is an encoder wheel that consists of alternating magnets or magnetic poles of opposing polarities that are arranged around the circumference of the wheel (e.g., alternating south-pole and north-pole magnets). This type of wheel may be referred to as a pole wheel. In this case the incremental speed sensor is placed in front of the encoder wheel and detects whether the measured magnetic field changes its polarity. In this case, the speed sensor generates an output signal that indicates that a pole passed by.

Figure 1B:
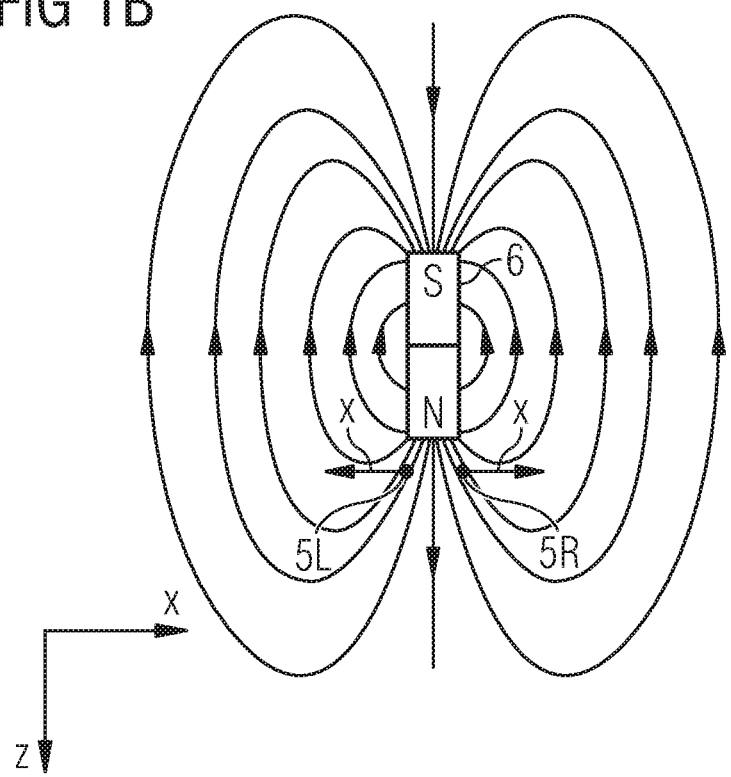

FIGS. 1A and 1B show a cross-sectional view illustrating a magnetic field sensing principle according to one or more embodiments. A sensor device 4, which may also be referred to as a sensor chip or a sensor circuit, may include two or more sensor elements disposed in a differential magnetic field produced by a magnet 6. The magnet 6 may be a standard low cost permanent magnet that generates a static magnetic field to the left side and the right side of the center of the magnet. This may also be referred to as a differential magnetic field, such that the amplitude of the magnetic field at the left side is equal to the amplitude of the magnetic field at the right side at equidistances from center.

The magnet 6 generates a static magnetic field, as shown in FIG. 1B. If a sensor (e.g., sensor element 5L or 5R) is placed at a certain distance from the magnet 6, then a static magnetic field is present at the sensor position. This static magnetic field can be expressed by a component in the x- and y-direction as illustrated in FIG. 1B. For a magnetic sensing module (i.e., including the magnet 6 and the sensor device 4) the magnetic operation point (MOP) is defined as the measured field by the sensor in the absence of a target object, such as a wheel.

If two x-sensitive sensors are used with a certain displacement about the center of the magnet 6, then the MOP of the left sensor 5L and the right sensor 5R have a different sign. This differential magnetic field, also called differential MOP or offset field, may be large. In the presence of a wheel, the MOP of the sensor is influenced and depends on the angle of the wheel. The differential sensing module with a large MOP (x-sensitive sensors) generates a differential output signal around this MOP, i.e., with a large offset.

Thus, two sensor elements 5L and 5R are shown that are differentially displaced from each other such that one sensor element resides in half of the differential magnetic field, and the other sensor element resides in the other half of the differential magnetic field. The concept of using two sensor elements 5L and 5R may also be expanded to sensor element pairs 5L and 5R, where pairs of sensor elements are arranged at differentially spaced sensing regions that detect a same static magnetic field. These sensor element pairs 5L and 5R may be arranged in a sensor bridge configuration to generate a differential measurement signal.

In this example, the field amplitude of the differential magnetic field at the two locations is the same, but the sign of the magnetic field is opposite. In this example, an x-field component ($B_{xl}$) of the magnetic field at sensor element 5L is −20 mT, while the x-field component ($B_{xr}$) of the magnetic field at sensor element 5R is +20 mT. Here, when the left and the right MOP are −20 mT and +20 mT, respectively, the differential magnetic field measured is 40 mT. In this case, it is said that the MOPs are symmetric.

It will be appreciated that field of 20 mT serves only as an example, and that the embodiments provided herein are not limited thereto. In addition, sensor elements 5L and 5R may be placed at locations where the field amplitude is different from each other or asymmetric (e.g., at −20 mT and −10 mT, or −20 mT and +10 mT).

It will also be appreciated that sensor elements 5L and 5R may each represent a pair of sensor elements where a pair of sensor elements is arranged substantially at each location or region on the sensor chip having a same MOP. Each of the sensor elements 5L and 5R may have their reference directions aligned along a same sensing axis (e.g., the x-axis) and directed in a same sensing direction (e.g., x-direction or −x-direction). Thus, the sensor elements 5L and 5R are sensitive to an x-field component (Bx) produced by the magnet 6. Here, to sense an equivalent x-field component (Bx), sensor elements of a sensor pair may be aligned with each other in the y-direction on the sensor chip. In addition, the reference directions are not limited to the above orientation and may be fixed in other orientations.

FIG. 1C illustrates a magnetic field sensing principle with a magnetic encoder according to one or more embodiments. One type of magnetic encoder may be a ferromagnetic encoder, which may be a toothed wheel or a toothed disc of ferromagnetic material with holes or notches that pass in front of the magnetic field sensor. It will be appreciated that similar principles apply to a pole wheel.

Similar to that of FIG. 1A, a differential magnetic field may be produced by a back bias magnet 6 coupled to a backside of the magnetic field sensor. Thus, the magnetic field pattern of the magnetic field produced by the back bias magnet 6 may be altered by the passing of teeth 2 and notches 3 of the rotating magnetic encoder 1. Hence, the strength of the of the magnetic field produced by the back bias magnet 6 in certain sensing planes and sensing directions (e.g., x-, y-, and z-planes and directions) may be altered according to the change in the magnetic field pattern.

FIG. 1C shows a toothed wheel 1 that may rotate in either rotation direction and has alternating teeth 2 and notches 3, according to one or more embodiments. In particular, the toothed wheel 1 may be made of a ferromagnetic material (e.g., iron) that attracts magnetic fields. In addition, a sensor device 4 is arranged in a side-read configuration in which the toothed wheel 1 is arranged laterally with respect to the sensitive measuring elements of the sensor device 4. For example, the sensor device 4 may be placed between the rotating magnetic encoder 1 and a back bias magnet 6, as shown, such that the sensor elements arranged laterally with respect to the toothed wheel 1.

The sensor device 4 may include two pairs of sensor elements 5L and 5R that are arranged in a bridge configuration and are configured to sense a differential magnetic field produced by the back bias magnet 6. Together, the sensor device 4 and the back bias magnet 6 may comprise a sensor module. The sensor device 4 may generally be referred to herein as sensor 4, may further include a sensor circuit (not shown), and may be disposed in a sensor package.

The back bias magnet is used to generate a field that is modulated by the tooth of the rotating wheel 1. A speed signal is generated as a measurement of the differential magnetic field on the left and the right sensing element locations. In particular, as the toothed wheel 1 rotates, the teeth 2 and notches 3 alternate passing by the sensor module including the back bias magnet 6 and the pair of sensor elements 5L and 5R.

In the instance of a tooth 2 passing the sensor module, the magnetic field lines of the bias magnetic field produced by the back bias magnet 6 are pulled in the z-direction towards the tooth 2. Thus, the magnetic field lines are pulled away from the x- and y-planes and a sensed magnetic field strength in the x- and y-directions is reduced such that a minimum field strength of Bx and By in the in the x- and y-directions would be detected at the center of the tooth 2.

In contrast, a sensed magnetic field strength of Bz in the z-direction is increased such that a maximum field strength in the z-direction would be detected at the center of the tooth 2. This may differ in real-world applications where the minimum may not occur exactly at the center due to assembly tolerances, but the minimum field strength should be detected substantially at the center of the tooth 2.

Conversely, in the instance of a notch 3 passing the sensor module, magnetic field lines of the bias magnetic field produced by the back bias magnet 6 are not pulled (or are less pulled) in the z-direction towards the notch 3. Thus, the magnetic field lines remain concentrated relative to the x- and y-planes and the sensed magnetic field strength of Bx and By in the x- and y-directions would be at a maximum in the x- and y-directions at the center of the notch 3.

In contrast, a sensed magnetic field strength in the z-direction is reduced such that a minimum field strength in the z-direction would be detected at the center of the notch 2. This may differ in real-world applications where the maximum may not occur exactly at the center, but the maximum field strength should be detected substantially at the center of the notch 3.

The two pairs of magnetic field sensor elements 5L and 5R in may be referred to as differential pairs of sensor elements that are configured to convert the differential magnetic field applied to the left side and the right side of the sensor device 4 into a differential output voltage (i.e., a differential signal). In such a differential bridge configuration, the sensor signals from each sensor element of the differential pair of sensor elements 5L and 5R may be provided within the sensor circuit (i.e., the bridge circuit) that is configured to generate a differential signal at the bridge output Vout. Due to the bridge configuration, the differential signal may cancel out homogeneous and/or non-homogenous stray-fields in the sensing axis of the xMR sensor. However, with a mismatch of the MOP due to the differential MOP, homogeneous stray fields may influence the output of the bridge and stray field robustness may not be fully realized.

In addition, each differential pair of sensor elements 5L and 5R may be disposed from a center of the magnetic field at a distance of about half of a pitch of wheel 1 in order to generate a differential signal with high signal to noise ratio. That is, the distance between the differential pair of sensor elements 5L and 5R, both being spaced about half a pitch from center, may be matched or substantially matched (e.g., within 5% to allow for manufacturing tolerances) to the pitch of the wheel 1. A pitch is the distance along a pitch circle between two adjacent teeth of a toothed wheel. However, it will be appreciated that other spacing arrangements are also possible and used especially if the wheel is used to transmit mechanical forces. Lastly, leads 7 provide an electrical pathway for various input and output signals (e.g., power signals, command signals, and output signals) to and from the sensor device 4.

Referring to the configuration shown in FIG. 1C as an example, as the wheel 1 rotates, the teeth 2 and notches 3 alternate past the sensor module and the differential pair of sensor elements (or the four resistors within a Wheatstone bridge configuration) 5L and 5R sense a change in the x-axis magnetic field strength Bx that varies as a sinusoidal-like waveform (i.e., as a signal modulation), the frequency of which corresponds to a speed of rotation of the wheel 1. Thus, the sensor circuit of the sensor device 4 receives signals (i.e., sensor signals) from each sensor element of the differential pairs of sensor elements 5L and 5R and derives, from the sensor signals, a differential signal that represents the magnetic field as a signal modulation. The differential signal may then be output as an output signal to an external controller, control unit or processor (e.g., an electronic control unit (ECU)), or used internally by the sensor circuit for further processing (e.g., to generate a pulsed output signal) before being output to an external device. For example, the external device may count the pulses of the pulsed output signal and calculate a wheel-speed therefrom.

Alternatively, the differential signal may represent an angle measurement, a position measurement, or a rotation direction measurement according to the implementation of the sensor device 4 and its target object. Furthermore, additional differential pair of sensor elements may be provided and configured to generate any type of differential signal representative of a differential magnetic field, including those types of measurements signals provided herein. Also, two or more sets of differential pairs of sensor elements may be used in combination, each configured to generate a differential signal such that additional information related to the target object can be obtained. For example, a differential speed signal may be used in combination with a differential direction signal in an speed sensor. In the this arrangement, the two differential sensors may be placed with a certain distance to each other. As another example, a differential x-angle sensor signal may be used in combination with a differential y-angle sensor signal in an angle sensor.

Figure 2:
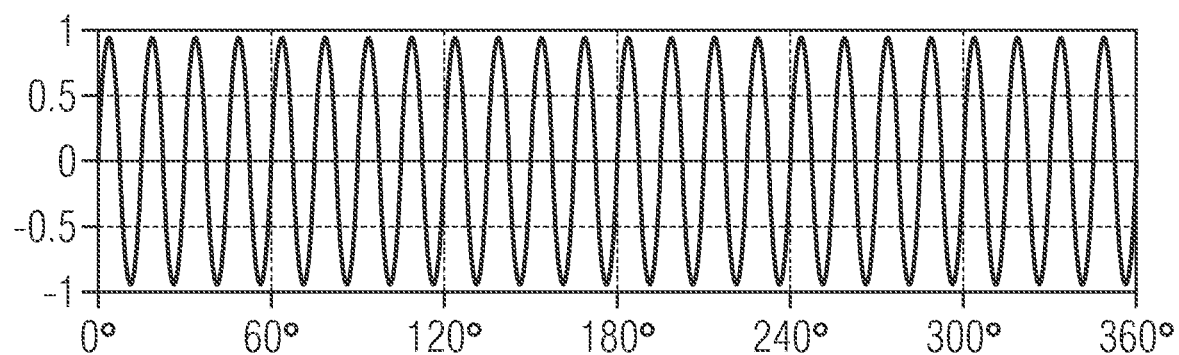
FIG. 2 is an example of a normalized sinusoidal waveform generated by a sensor arrangement of a magnetic speed sensor.

FIG. 2 is an example of a normalized sinusoidal waveform generated by the sensors of the sensor device 4 of a magnetic speed sensor. In particular, FIG. 2 shows a full revolution speed sensor signal response of one full revolution of an encoder wheel discussed above in FIG. 1C. However, the signal shape—especially on smaller airgaps—is different and depends on the shape of the teeth of the wheel.

A pole pair includes an adjacent tooth and notch on a toothed wheel. Typically, for speed applications, a number of teeth on a tooth wheel, translates into a number of sine waveforms for a full revolution of 360°. For this example, the encoder wheel 1 would include 24 pole pairs according to the sinusoidal waveform shown in FIG. 2.

As can be seen from the waveform, an output signal based on a sensed magnetic field that oscillates between two extrema (e.g., a minimum and a maximum) in accordance with the rotation of the encoder wheel. A processor may be configured to calculate a wheel-speed and rotation direction of the rotating encoder wheel 1 based on the output signals generated by the sensors.

Figure 3:
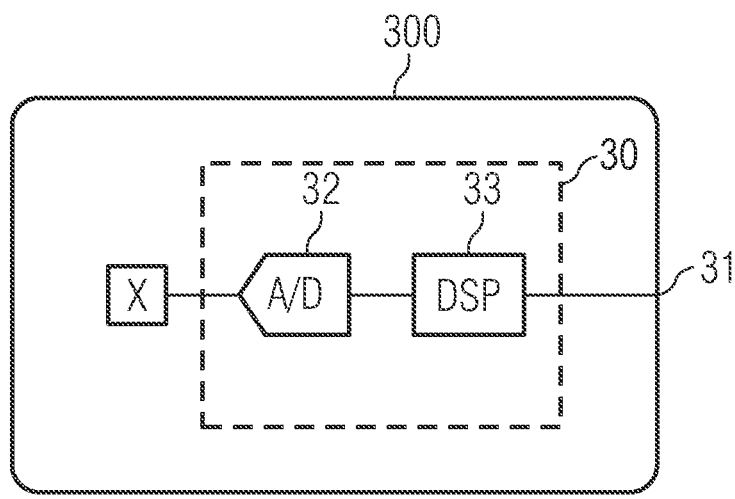
FIG. 3 is a schematic block diagram illustrating a magnetic speed sensor according to one or more embodiments.

FIG. 3 is a schematic block diagram illustrating a magnetic speed sensor 300 according to one or more embodiments. The magnetic speed sensor 300 includes sensor arrangement X that is configured to generate a differential sensor signal in response to a magnetic field impinging thereon. In particular, sensor arrangement X may represent a resistor bridge that includes two differential pairs of sensor elements arranged in a bridge configuration.

The magnetic speed sensor 300 also includes a sensor circuit 30 that receives the differential sensor signal from the sensor arrangement X for processing and for generation of pulsed output speed signal at output 31. In particular, the differential sensor signal may be received by an ADC 32 that converts the analog signal into a digital signal, and outputs the digital signal to a DSP 33 for further processing.

The digital signal processor 33 may include one or more processors and/or logic units that performs various signal conditioning functions, such as absolute signal conversion, normalization, linearization, frequency increase, and so forth. One or more signal conditioning functions may be performed in combination with a lookup table stored in memory. The output 31 of the digital signal processor 33 may provide one or more output signals to an external device, such as an ECU. The digital signal processor 33 may also be implemented as digital logic.

For example, the speed of rotation of the target object may be output as a speed pulse signal. Thus, the sinusoidal signal generated by the sensor arrangement X may be translated by the digital signal processor 33 into pulses, which may be further translated into a movement detection or a speed output. In addition, the digital signal processor 33 may receive two or more differential sensor signals from different sets of differential pairs of sensor elements for determining additional information related to the target object.

FIG. 4 is a schematic diagram illustrating two possible sensor bridge configurations using four xMR sensor elements. For example, FIG. 4 illustrates an example of a magnetic sensor bridge circuit X that generates a differential sensor signal Sx and includes four xMR sensor elements Z1, Z2, Z3, and Z4 with arrows provided to denote a direction of a pinned-layer magnetization of each sensor element aligned in the x-direction. In this case, it can be said that the magnetic sensor has an x-sensing axis. The sensor is coupled to a magnet that produces a static magnetic field and that has an MOP of +/−20 mT at the sensor locations, which results in a differential magnetic field of 40 mT.

Due to this differential MOP, the magnetic sensor bridge circuit X may be out of equilibrium. For example, the sensor elements Z1 and Z2 on the left side may of the bridge circuit may exhibit a smaller resistance than the resistance exhibited by the sensor elements Z3 and Z4 on the right side of the bridge circuit. Furthermore, when a stray field is introduced, it further modulates the offset generated at the output of the bridge circuit. However, as will be explained, by reducing the sensitivity of the sensor device, the offset may also be reduced.

Sensor elements Z1 and Z2 make up a first pair of sensor elements that are disposed in a region exposed to a first portion of a differential magnetic field having a field strength of −20 mT. Similarly, sensor elements Z3 and Z4 make up a second pair of sensor elements that are disposed in a region exposed to a second portion of the differential magnetic field having a field strength of +20 mT. The first portion and the second portion of the differential magnetic field have opposite magnitudes.

In addition, sensor element pairs may be placed at locations where the field amplitude is different from each other (e.g., at −20 mT and −10 mT). In this case, the MOP is said to by asymmetric.

A first leg of the magnetic sensor bridge circuit X comprises a first magnetoresistive sensor element Z1 and a fourth magnetoresistive sensor element Z4. The first and the fourth magnetoresistive sensor elements Z1 and Z4 are connected in series. Furthermore, a second leg of the magnetic sensor bridge circuit X comprises a second magnetoresistive sensor element Z2 and a third magnetoresistive sensor element Z3. The third and the second magnetoresistive sensor elements Z3 and Z2 are connected in series. The first and the third magnetoresistive sensor elements Z1 and Z3 are connected to a first supply terminal of the magnetic sensor bridge circuit X. The second and the fourth magnetoresistive sensor elements Z2 and Z4 are connected to a second, different supply terminal of the magnetic sensor bridge circuit X. It will be appreciated that the specific directions of each pinned-layer magnetization, as shown, may be rotated by 180° as a matter of design.

The differential sensor signal Sx is a function of the magnetic field measured at the two locations where the two pairs of sensor elements are provided. Each leg of the two legs of the magnetic sensor bridge circuit X has the same or substantially the same equivalent conductance or resistance such that each leg is in equilibrium (i.e., balanced) with the other. As a result, Sx is equal to zero when the magnetic sensor bridge circuit X is not exposed to an applied magnetic field. The bridge circuit is configured such that Sx changes linearly in response to a change in an applied magnetic field.

FIG. 4 further illustrates an example of a magnetic sensor bridge circuit Y that generates a differential sensor signal Sy and includes four xMR sensor elements Z1, Z2, Z3, and Z4 with arrows provided to denote a direction of a pinned-layer magnetization of each sensor element aligned in the y-direction. In this case, it can be said that the magnetic speed sensor 500 has a y-sensing axis.

A first leg of the magnetic sensor bridge circuit Y comprises a first magnetoresistive sensor element Z1 and a fourth magnetoresistive sensor element Z4. The first and the fourth magnetoresistive sensor elements Z1 and Z4 are connected in series. Furthermore, a second leg of the magnetic sensor bridge circuit Y comprises a third magnetoresistive sensor element Z3 and a second magnetoresistive sensor element Z2. The second and the third magnetoresistive sensor elements Z2 and Z3 are connected in series. The first and the third magnetoresistive sensor elements Z1 and Z3 are connected to a first supply terminal of the magnetic sensor bridge circuit Y. The second and the fourth magnetoresistive sensor elements Z2 and Z4 are connected to a second, different supply terminal of the magnetic sensor bridge circuit Y. It will be appreciated that the specific directions of each pinned-layer magnetization, as shown, may be rotated by 180° as a matter of design.

The differential sensor signal Sy is a function of the magnetic field measured at the two locations where the two pairs of sensor elements are provided.

Mathematically, the output of an xMR Wheatstone bridge with homogeneous stray field $B_{hom}$ is calculated from equation (1):

$$V_{out}(B_{MOP}) = V_b \frac{G_L - G_R}{G_L + G_R} \qquad \text{Equation (1)}$$

with the bias voltage $V_b$ and the conductance of the left and right sensor elements $G_L$ and $G_R$ given by equations (2) and (3), respectively:

$$G_L = G_0\left[1 + S_{B,L}\left(\frac{B_{sig,diff}}{2} + \frac{B_{MOP,diff}}{2} + B_{hom}\right)\right] \qquad \text{Equation (2)}$$

$$G_R = G_0\left[1 + S_{B,R}\left(-\frac{B_{sig,diff}}{2} - \frac{B_{MOP,diff}}{2} + B_{hom}\right)\right] \qquad \text{Equation (3)}$$

The result can be expressed in equation (4):

$$V_{out} \approx \frac{V_b S_B}{2(1 + S_B B_{hom})}\left(B_{sig,diff} + B_{MOP,diff} + \frac{S_{B,L} - S_{B,R}}{S_B} B_{hom}\right) \qquad \text{Equation (4)}$$

with $S_B$ is the (averaged) sensitivity of the sensor elements, $B_{sig,diff}$ the differential signal, $B_{MOP,diff}$ the differential magnetic offset field and $$\frac{S_{B,L} - S_{B,R}}{S_B}$$

the sensitivity mismatch between the left and right element. The factor $(1+S_B B_{hom})$ is a few percent and can have a significant impact, if the differential magnetic offset field is much larger than the signal ($B_{MOP,diff} \gg B_{sig,diff}$). Assuming in addition $S_B B_{hom} \ll 1$, the stray field dependent terms can be separated, as shown in equation (5):

$$V_{out} \approx \frac{V_b S_B}{2} \qquad \text{Equation (5)}$$

$$\left(B_{sig,diff} + B_{MOP,diff} + \left[B_{MOP,diff} S_B + \frac{S_{B,L} - S_{B,R}}{S_B}\right] B_{hom}\right)$$

Accordingly, a stray field suppression factor can be extracted, as shown in equation (6):

$$\frac{V_{out}(B_{sig,diff})/B_{sig,diff}}{V_{out}(B_{hom})/B_{hom}} = \frac{1}{S_B B_{MOP,diff} + \frac{S_{B,L} - S_{B,R}}{S_B}} \qquad \text{Equation (6)}$$

With a sensitivity mismatch of 1%, a differential MOP of $B_{MOP,diff}=1.5$ mT (with $S_B=0.7\%$/mT) reduces the stray field suppression already by a factor 2. Thus, on a mismatch of the differential MOP, homogeneous stray fields may influence the output of the bridge and stray field robustness may not be fully realized.

Figure 5A:
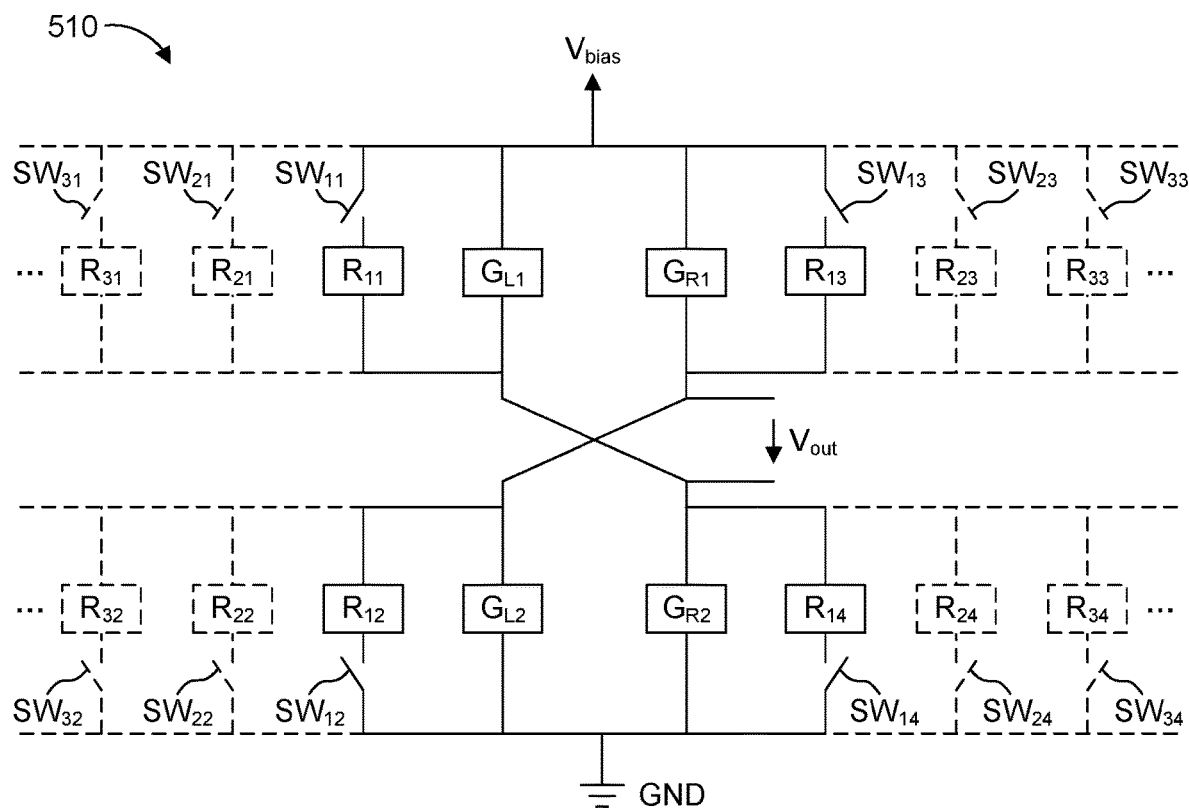
FIG. 5A is a schematic diagram illustrating an adjustable magnetic sensor bridge circuit according to one or more embodiments.
Figure 5B:
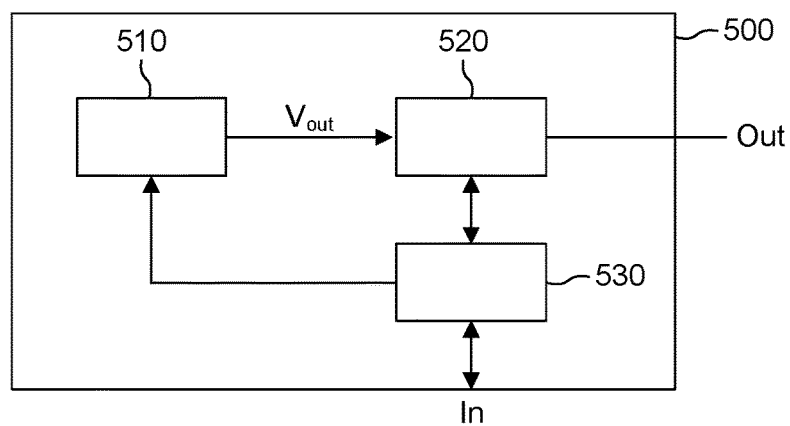
FIG. 5B is a schematic block diagram of a magnetic sensor according to one or more embodiments.

FIG. 5A shows a schematic diagram illustrating an adjustable magnetic sensor bridge circuit 510 according to one or more embodiments. FIG. 5B shows a schematic block diagram of a magnetic sensor 500 according to one or more embodiments. The magnetics sensor 500 includes the adjustable magnetic sensor bridge circuit 510, a processing unit 520 configured to perform signal processing on the output Vout of the adjustable magnetic sensor bridge circuit 510, and a control unit 530 configured to control a switching state of switches included in the adjustable magnetic sensor bridge circuit 510.

The processing unit 520 may include an ADC, a DSP, and/or one or more processors for processing the output Vout and performing signal conditioning thereon. Once output Vout has been processed by the processing unit 520, the processing unit may output the processed signal at an output terminal OUT to an external device, such as an electronic control unit (ECU). In addition, the control unit 530 may be a microcontroller or any other controller configured to control switching states of multiple switches.

The control unit 530 may receive configuration information from an input terminal IN that indicates which switches to enable, and may transmit control signals to the adjustable magnetic sensor bridge circuit 510 to control a switching state of each switch based on the configuration information.

Turning to FIG. 5A, the adjustable sensor bridge circuit includes xMR sensor elements $G_{L1}$, $G_{L2}$, $G_{R1}$, and $G_{R2}$, as similarly arranged according to one of the examples shown in FIG. 4, and respectably correspond to sensor elements Z1, Z2, Z3, and Z4. The sensor elements $G_{L1}$, $G_{L2}$, $G_{R1}$, and $G_{R2}$ may be referred to as primary resistive elements and may each have substantially the same equivalent conductance or resistance (i.e., within an acceptable manufacturing tolerance of 5%). Together, sensor elements $G_{L1}$, $G_{L2}$, $G_{R1}$, and $G_{R2}$ make up the core of the sensor bridge.

The magnetic sensor bridge circuit 510 generates a differential sensor signal Vout similar to output Sx or Sy of the bridge circuits illustrated in FIG. 4. Each of the primary resistive elements $G_{L1}$, $G_{L2}$, $G_{R1}$, and $G_{R2}$ have a pinned-layer magnetization aligned in the same direction (e.g., in the same x-direction or in the same y-direction), as similarly shown in FIG. 4. Thus, the magnetization directions (i.e., reference directions) are the same for each sensor element in the adjustable magnetic sensor bridge circuit 510.

As will be described below, additional, secondary resistive elements may be added in parallel to the primary resistive elements $G_{L1}$, $G_{L2}$, $G_{R1}$, and $G_{R2}$. These secondary resistive elements may be resistors made out of any material insensitive to magnetic fields, such as polysilicon. Thus, the secondary resistive elements may be poly resistors, but are not limited thereto.

Each sensor element $G_{L1}$, $G_{L2}$, $G_{R1}$, and $G_{R2}$ is provided at a different segment or quadrant of the adjustable magnetic sensor bridge circuit 510. In addition, each segment or quadrant of the adjustable magnetic sensor bridge circuit 510 has one or more parallel branches electrically coupled thereto, where each parallel branch includes a secondary resistive element coupled, via a corresponding switch, in parallel to a corresponding one of the sensor elements $G_{L1}$, $G_{L2}$, $G_{R1}$, and $G_{R2}$.

The secondary resistive elements may be fixedly coupled to the sensor bridge or may be switchably coupled to the sensor bridge circuit by, for example, a corresponding switch. In some cases, one or more sets of secondary resistive elements may be fixedly coupled to the sensor bridge and one or more sets of secondary resistive elements may be switchably coupled to the sensor bridge.

For example, a first synchronized set of resistors R11, R12, R13, and R14 are arranged in parallel to sensor elements $G_{L1}$, $G_{L2}$, $G_{R1}$, and $G_{R2}$, respectively. The first synchronized set of resistors R11, R12, R13, and R14 each have substantially the same conductance or resistance (i.e., within an acceptable manufacturing tolerance of 5%) and are switchably coupled and decoupled to their respective circuit segment in synchronization by respective switches SW11, SW12, SW13, and SW14. That is, the control unit 530 is configured to enable (i.e., closed) or disable (i.e., open) switches SW11, SW12, SW13, and SW14 simultaneously, in synchronization with one another. The switches SW11, SW12, SW13, and SW14 may also have a substantially matched conductance or resistance so that each parallel branch has the same equivalent conductance or resistance.

It will also be appreciated that instead of being switchably coupled to the sensor bridge, resistors R11, R12, R13, and R14 may be fixedly coupled to the sensor bridge by removing the corresponding switches SW11, SW12, SW13, and SW14. Thus, a connection without a switch may be implemented. In addition, a mix of fixedly coupled and switchably coupled resistors among resistors R11, R12, R13, and R14 may be used.

When switches SW11, SW12, SW13, and SW14 are closed, a portion of the bridge current flows through the resistors R11, R12, R13, and R14 instead of entirely through the sensor elements $G_{L1}$, $G_{L2}$, $G_{R1}$, and $G_{R2}$ such that the bridge circuit 510 is balanced. As a result, the sensitivity of the each of the sensor elements $G_{L1}$, $G_{L2}$, $G_{R1}$, and $G_{R2}$ to magnetic fields, including stray fields, is reduced. Since the sensitivity of the sensor elements $G_{L1}$, $G_{L2}$, $G_{R1}$, and $G_{R2}$ is reduced, modulation due to the stray field is also reduced, which limits the effect of stray fields on the offset caused by a differential magnetic field. Thus, while the sensitivity of the magnetic sensor may be reduced as whole when the first synchronized set of resistors R11, R12, R13, and R14 is activated, the magnetic sensor gains more robustness to stray fields.

In addition, a second or further additional synchronized set of resistors may be added in parallel to each sensor element $G_{L1}$, $G_{L2}$, $G_{R1}$, and $G_{R2}$. For example, a second synchronized set of resistors R21, R22, R23, and R24 are arranged in parallel to sensor elements $G_{L1}$, $G_{L2}$, $G_{R1}$, and $G_{R2}$, respectively. The second synchronized set of resistors R21, R22, R23, and R24 each have substantially the same conductance or resistance (i.e., within an acceptable manufacturing tolerance of 5%) and are switchably coupled and decoupled to their respective circuit segment in synchronization by respective switches SW21, SW22, SW23, and SW24. That is, the control unit 530 is configured to enable (i.e., closed) or disable (i.e., open) switches SW21, SW22, SW23, and SW24 simultaneously, in synchronization with one another. The switches SW21, SW22, SW23, and SW24 may also have a substantially matched conductance or resistance so that each parallel branch has the same equivalent conductance or resistance.

It will also be appreciated that instead of being switchably coupled to the sensor bridge, resistors R21, R22, R23, and R24 may be fixedly coupled to the sensor bridge by removing the corresponding switches SW21, SW22, SW23, and SW24. Thus, a connection without a switch may be implemented. In addition, a mix of fixedly coupled and switchably coupled resistors among resistors R21, R22, R23, and R24 may be used.

The second synchronized set of resistors R21, R22, R23, and R24 may have a resistance that is equal to or different from the resistance of the first synchronized set of resistors R11, R12, R13, and R14. In addition, switches SW21, SW22, SW23, and SW24 may be controlled independently from switches SW11, SW12, SW13, and SW14. Thus, this arrangement allows the sensitivity of the sensor elements $G_{L1}$, $G_{L2}$, $G_{R1}$, and $G_{R2}$ to be adjusted by coupling one or more sets of secondary resistive elements via control of their respective switches. While the sensitivity of the magnetic sensor may be reduced as whole when one or more parallel branches is activated, the magnetic sensor gains more robustness to stray fields.

A third synchronized set of resistors may be provided in parallel to each sensor element $G_{L1}$, $G_{L2}$, $G_{R1}$, and $G_{R2}$. For example, a third synchronized set of resistors R31, R32, R33, and R34 are arranged in parallel to sensor elements $G_{L1}$, $G_{L2}$, $G_{R1}$, and $G_{R2}$, respectively. The third synchronized set of resistors R31, R32, R33, and R34 each have substantially the same conductance or resistance (i.e., within an acceptable manufacturing tolerance of 5%) and are switchably coupled and decoupled to their respective circuit segment in synchronization by respective switches SW31, SW32, SW33, and SW34. That is, the control unit 530 is configured to enable (i.e., closed) or disable (i.e., open) switches SW31, SW32, SW33, and SW34 simultaneously, in synchronization with one another. The switches SW31, SW32, SW33, and SW34 may also have a substantially matched conductance or resistance so that each parallel branch has the same equivalent conductance or resistance.

It will also be appreciated that instead of being switchably coupled to the sensor bridge, resistors R31, R32, R33, and R34 may be fixedly coupled to the sensor bridge by removing the corresponding switches SW31, SW32, SW33, and SW34. Thus, a connection without a switch may be implemented. In addition, a mix of fixedly coupled and switchably coupled resistors among resistors R31, R32, R33, and R34 may be used.

The third synchronized set of resistors R31, R32, R33, and R34 may have a resistance that is equal to or different from the resistance of the first and/or second synchronized set of resistors. In addition, switches SW31, SW32, SW33, and SW34 may be controlled independently from the other two sets of switches. Thus, this arrangement allows the sensitivity of the sensor elements $G_{L1}$, $G_{L2}$, $G_{R1}$, and $G_{R2}$ to be adjusted by coupling one or more sets of secondary resistive elements via control of their respective switches. While the sensitivity of the magnetic sensor may be reduced as whole when one or more parallel branches is activated, the magnetic sensor gains more robustness to stray fields. It is also possible that none of the switches are enabled such that the full sensitivity of the sensor elements $G_{L1}$, $G_{L2}$, $G_{R1}$, and $G_{R2}$ is realized.

The control unit 530 may receive configuration information from an input terminal IN that indicates which set of switches to enable, and may transmit control signals to the adjustable magnetic sensor bridge circuit 510 to control a switching state of each switch based on the configuration information. Thus, one or more synchronized set of resistors may be coupled to the core sensor bridge based on the configuration information.

It is further noted that the placement of the secondary resistive elements on the sensor chip is not limited. They may be placed in a separate area on the sensor chip from the primary resistive elements, and/or may be grouped together to ensure a good matching between respective resistances.

Figure 6:
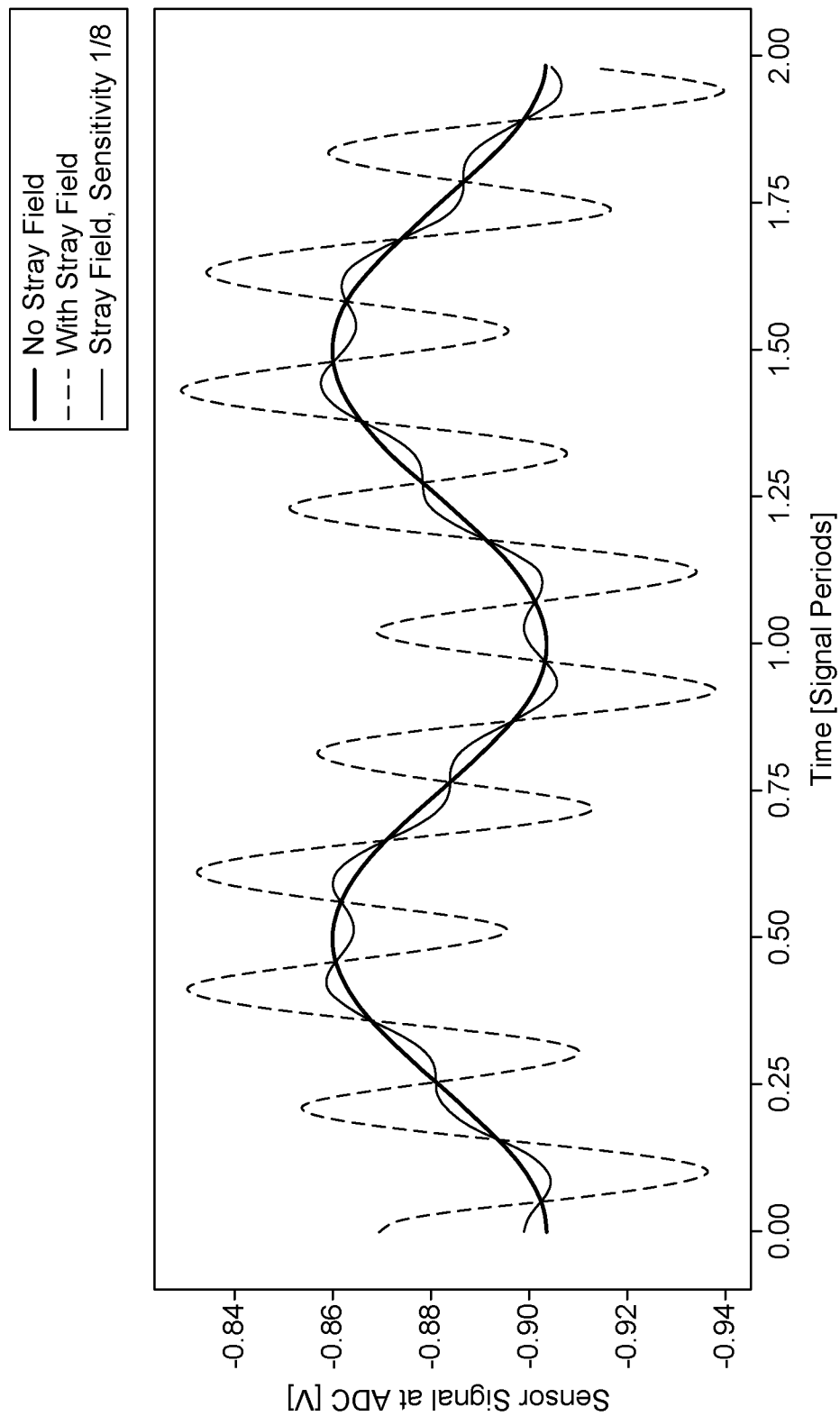
FIG. 6 illustrates different waveforms for a sensor signal according to one or more embodiments.

FIG. 6 illustrates three different waveforms for a speed sensor signal or for a direction sensor signal according to one or more embodiments. In particular, the speed sensor signal or the direction sensor signal is shown as the output of an ADC derived from output Vout of the adjustable magnetic sensor bridge circuit 510. Example waveforms are shown for instances when no stray field is present and all switches are disabled (i.e., normal or full sensitivity), when a stray field is present and all switches are disabled (i.e., normal or full sensitivity), and when a stray field is present and at least one of the synchronized set of resistors are coupled such that a sensitivity is reduced to ⅛ of the normal sensitivity (i.e., reduced sensitivity).

The stray field suppression in the presence of an offset field using a side-read arrangement may be improved by lowering the sensitivity of the sensor signal path. This could also be achieved by lowering the sensitivity of the sensing element in general. However, the possibility to change the sensitivity on the sensor chip allows to maintain high sensitivity and performance for pole wheel and top-read applications, and make use of a higher sensitivity in a stray field robust direction path.

The sensitivity is reduced by adding a parallel path to each xMR element containing a resistor and a switch (or also in series for a GMR element). With the switch closed the new sensitivity is given by equation (7):

$$S_B^* = \frac{S_B}{\left(\frac{G_{poly}}{G_{TMR}} + 1\right)} \qquad \text{Equation (7)}$$

where $G_{TMR}$ is the conductance of the xMR sensor element (e.g., a TMR sensor element) and $G_{poly}$ is the conductance of an additional resistor (e.g., R11) connected in parallel to the xMR sensor) or the equivalent conductance of multiple resistors (e.g., R11, R21, and R31) connected in parallel to the xMR sensor element. Multiple resistor-switch branches may be added for a finer tuneability of the sensitivity and thereby allowing to optimize the stray field robustness and performance for each target application.

Further, the coupling different parallel paths may be used to compensate for a sensitivity mismatch in the sensor elements themselves. For example, if one of the sensor elements is determined, for example, by signal processing by a processor, to be more sensitive than its counterparts, the sensitivity of this sensor element may be adjusted (e.g., reduced) by enabling one or more of its parallel paths.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A magnetic sensor, comprising:
a bridge circuit comprising a plurality of magnetic field sensor elements, each configured to generate a sensor signal in response to the magnetic field impinging thereon, wherein the bridge circuit is configured to generate a differential signal based on sensor signals generated by the plurality of magnetic field sensor elements,
wherein the bridge circuit further comprises a plurality of resistors that are insensitive to magnetic fields, wherein each of the plurality of magnetic field sensor elements is coupled in parallel to at least one resistor of the plurality of resistors.

2. The magnetic sensor of claim 1, wherein a conductance of each of the plurality of magnetic field sensor elements is substantially the same.

3. The magnetic sensor of claim 1, wherein the plurality of magnetic field sensor elements are magnetoresistive sensor elements sensitive to a same magnetic field component of the magnetic field and each having a reference magnetization aligned in a same sensing direction.

4. The magnetic sensor of claim 1, further comprising:
at least one switch, each coupled to a different resistor of the plurality of resistors and configured to switchably couple the different resistor to the bridge circuit.

5. The magnetic sensor of claim 1, wherein each of the plurality of resistors is coupled in parallel to only one of the plurality of magnetic field sensor elements.

6. A magnetic sensor, comprising:
a bridge circuit comprising a plurality of magnetic field sensor elements, each configured to generate a sensor signal in response to the magnetic field impinging thereon, wherein the bridge circuit is configured to generate a differential signal based on sensor signals generated by the plurality of magnetic field sensor elements,
wherein the bridge circuit further comprises a plurality of resistors, wherein each of the plurality of magnetic field sensor elements is coupled in parallel to at least one resistor of the plurality of resistors,
wherein the bridge circuit further comprises a first plurality of parallel branches including a first plurality of resistors of the a plurality of resistors and a first plurality of switches, wherein each parallel branch of the first plurality of parallel branches includes a corresponding first resistor of the first plurality of resistors and a corresponding first switch of the first plurality of switches, and wherein each parallel branch of the first plurality of parallel branches is switchably coupled in parallel to a different one of the plurality of magnetic field sensor elements based on a switching state of the corresponding first switch, and the magnetic sensor further comprises:
a controller configured to transmit control signals to the bridge circuit for controlling switching states of the first plurality of switches.

7. The magnetic sensor of claim 6, wherein the switching states of the first plurality of switches are synchronized.

8. The magnetic sensor of claim 6, wherein a conductance of each of the first plurality of resistors is substantially the same.

9. The magnetic sensor of claim 6, wherein the bridge circuit further comprises:
a second plurality of parallel branches including a second plurality of resistors of the plurality of resistors and a second plurality of switches, wherein each parallel branch of the second plurality of parallel branches includes a corresponding second resistor of the second plurality of resistors and a corresponding second switch of the second plurality of switches, and wherein each parallel branch of the second plurality of parallel branches is switchably coupled in parallel to a different one of the plurality of magnetic field sensor elements based on a switching state of the corresponding second switch, and wherein the controller is configured to transmit the control signals to the bridge circuit for controlling switching states of the second plurality of switches.

10. The magnetic sensor of claim 9, wherein the switching states of the second plurality of switches are synchronized.

11. The magnetic sensor of claim 9, wherein a conductance of each of the second plurality of resistors is substantially the same.

12. The magnetic sensor of claim 11, wherein a conductance of each of the first plurality of resistors is substantially the same, and the conductance of the first plurality of resistors is different from the conductance of the second plurality of resistors.

13. The magnetic sensor of claim 11, wherein a conductance of each of the first plurality of resistors is substantially the same, and the conductance of the first plurality of resistors is substantially equivalent to the conductance of the second plurality of resistors.

14. The magnetic sensor of claim 9, wherein:
the controller is configured to control the switching states of the first plurality of switches independently from the switching states of the second plurality of switches.

15. The magnetic sensor of claim 6, wherein:
the controller is configured to receive configuration information and to control the switching states of the first plurality of switches based on the configuration information.

16. The magnetic sensor of claim 6, wherein the plurality of resistors are insensitive to magnetic fields.

17. A magnetic sensor module, comprising:
a magnet configured to produce a differential magnetic field, the differential magnetic field having a first differential field portion and a second differential field portion; and
a bridge circuit comprising a plurality of magnetic field sensor elements, including a first pair of sensor elements disposed in the first differential field portion and a second pair of sensor elements disposed in the second differential field portion, wherein the bridge circuit is configured to generate a differential signal based on sensor signals generated by the plurality of magnetic field sensor elements,
wherein the bridge circuit further comprises a plurality of resistors that are insensitive to magnetic fields, wherein each of the plurality of magnetic field sensor elements is coupled in parallel to at least one resistor of the plurality of resistors.

18. The magnetic sensor module of claim 17, wherein the plurality of magnetic field sensor elements are magnetoresistive sensor elements sensitive to a same magnetic field component of the magnetic field and each having a reference magnetization aligned in a same sensing direction.

19. The magnetic sensor module of claim 17, wherein each of the plurality of resistors is coupled in parallel to only one of the plurality of magnetic field sensor elements.

20. A magnetic sensor module, comprising:
a magnet configured to produce a differential magnetic field, the differential magnetic field having a first differential field portion and a second differential field portion; and
a bridge circuit comprising a plurality of magnetic field sensor elements, including a first pair of sensor elements disposed in the first differential field portion and a second pair of sensor elements disposed in the second differential field portion, wherein the bridge circuit is configured to generate a differential signal based on sensor signals generated by the plurality of magnetic field sensor elements,
wherein the bridge circuit further comprises a plurality of resistors, wherein each of the plurality of magnetic field sensor elements is coupled in parallel to at least one resistor of the plurality of resistors,
wherein the bridge circuit further comprises a first plurality of parallel branches including a first plurality of resistors of the plurality of resistors and a first plurality of switches, wherein each parallel branch of the first plurality of parallel branches includes a corresponding first resistor of the first plurality of resistors and a corresponding first switch of the first plurality of switches, and wherein each parallel branch of the first plurality of parallel branches is switchably coupled in parallel to a different one of the plurality of magnetic field sensor elements based on a switching state of the corresponding first switch, and the magnetic sensor module further comprises:
a controller configured to transmit control signals to the bridge circuit for controlling switching states of the first plurality of switches.

21. The magnetic sensor module of claim 20, wherein:
the bridge circuit includes a first leg and a second leg connected in parallel between a first supply terminal and a second supply terminal,
the first leg includes a first sensor element of the first pair of sensor elements coupled to the first supply terminal and a first sensor element of the second pair of sensor elements coupled to the second supply terminal, and
the second leg includes a second sensor element of the first pair of sensor elements coupled to the second supply terminal and a second sensor element of the second pair of sensor elements coupled to the first supply terminal.

22. The magnetic sensor module of claim 20, wherein the switching states of the first plurality of switches are synchronized.

23. The magnetic sensor module of claim 20, wherein the bridge circuit further comprises:
a second plurality of parallel branches including a second plurality of resistors of the plurality of resistors and a second plurality of switches, wherein each parallel branch of the second plurality of parallel branches includes a corresponding second resistor of the second plurality of resistors and a corresponding second switch of the second plurality of switches, and wherein each parallel branch of the second plurality of parallel branches is switchably coupled in parallel to a different one of the plurality of magnetic field sensor elements based on a switching state of the corresponding second switch, and
wherein the controller is configured to transmit the control signals to the bridge circuit for controlling switching states of the second plurality of switches.

24. The magnetic sensor module of claim 20, wherein the plurality of resistors are insensitive to magnetic fields.

* * * * *